United States Patent
Schiepp et al.

(10) Patent No.: US 10,928,625 B2
(45) Date of Patent: Feb. 23, 2021

(54) ACTUATOR DEVICE AND METHOD FOR OPERATING AN ACTUATOR DEVICE

(71) Applicant: ETO MAGNETIC GmbH, Stockach (DE)

(72) Inventors: Thomas Schiepp, Seitingen-Oberflacht (DE); Markus Laufenberg, Stockach (DE)

(73) Assignee: ETO MAGNETIC GmbH, Stockach (DE)

( * ) Notice: Subject to any disclaimer, the term of this patent is extended or adjusted under 35 U.S.C. 154(b) by 259 days.

(21) Appl. No.: 16/094,962

(22) PCT Filed: Apr. 18, 2017

(86) PCT No.: PCT/EP2017/059198
§ 371 (c)(1),
(2) Date: Oct. 19, 2018

(87) PCT Pub. No.: WO2017/182473
PCT Pub. Date: Oct. 26, 2017

(65) Prior Publication Data
US 2019/0121120 A1 Apr. 25, 2019

(30) Foreign Application Priority Data

Apr. 22, 2016 (DE) ............ 10 2016 107 461.6

(51) Int. Cl.
*G02B 26/08* (2006.01)
*H01L 41/12* (2006.01)
(Continued)

(52) U.S. Cl.
CPC .......... *G02B 26/085* (2013.01); *F03G 7/065* (2013.01); *F16F 15/03* (2013.01); *F16F 15/06* (2013.01);
(Continued)

(58) Field of Classification Search
None
See application file for complete search history.

(56) References Cited

U.S. PATENT DOCUMENTS

| 5,920,421 | A | * | 7/1999 | Choi | ............... | G02B 26/0858 |
| | | | | | | 359/224.1 |
| 6,384,952 | B1 | * | 5/2002 | Clark | ................. | G02B 26/06 |
| | | | | | | 359/224.1 |

(Continued)

FOREIGN PATENT DOCUMENTS

| CN | 1633021 A | 6/2005 |
| DE | 102011106616 A1 | 11/2012 |

(Continued)

OTHER PUBLICATIONS

Search Report dated Feb. 1, 2017 issued in corresponding DE patent application No. 10 2016 107 461.6 (and partial English translation thereof).

(Continued)

*Primary Examiner* — Jennifer D. Carruth
(74) *Attorney, Agent, or Firm* — Posz Law Group, PLC

(57) ABSTRACT

An actuator device includes at least one stationary unit, with at least one electromagnetic actuator element which is movable relative to the stationary unit, and with at least one shape-memory element which is implemented at least partly of a shape-shiftable shape-memory material, wherein the shape-memory element is configured, in at least one operation state, to at least partly hinder a movement of the actuator element in a first movement direction and in a second movement direction that differs from the first movement direction, at least via a mechanical deformation.

19 Claims, 4 Drawing Sheets

Figure 1:
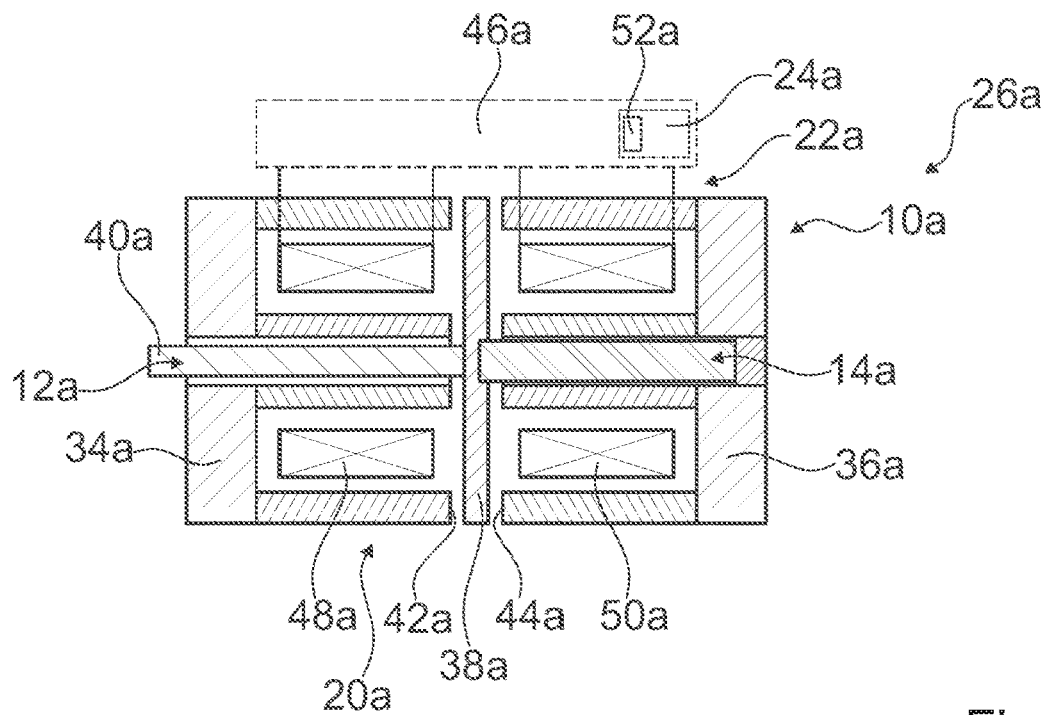

(51) Int. Cl.
  *F16K 31/06* (2006.01)
  *F16F 15/06* (2006.01)
  *F16F 15/03* (2006.01)
  *F03G 7/06* (2006.01)
  *F16K 31/02* (2006.01)
  *H01F 7/08* (2006.01)
  *H01F 7/16* (2006.01)

(52) U.S. Cl.
  CPC ........ *F16K 31/025* (2013.01); *F16K 31/0675* (2013.01); *F16K 31/0679* (2013.01); *H01F 7/081* (2013.01); *H01F 7/16* (2013.01); *H01L 41/12* (2013.01); *H01F 2007/086* (2013.01)

(56) References Cited

U.S. PATENT DOCUMENTS

| | | | | |
|---|---|---|---|---|
| 6,552,839 | B1* | 4/2003 | Hong | B81B 3/0054 |
| | | | | 310/309 |
| 6,733,144 | B2* | 5/2004 | Kwon | B81B 3/0051 |
| | | | | 359/221.1 |
| 7,071,109 | B2* | 7/2006 | Novotny | G02B 26/0841 |
| | | | | 438/692 |
| 7,200,298 | B2* | 4/2007 | Kimura | G02B 26/0808 |
| | | | | 359/291 |
| 7,706,044 | B2* | 4/2010 | Lin | G02B 26/001 |
| | | | | 359/254 |
| 7,719,752 | B2* | 5/2010 | Sampsell | G02B 5/284 |
| | | | | 359/290 |
| 8,082,651 | B2* | 12/2011 | Zaitsu | B81C 1/00174 |
| | | | | 29/513 |
| 10,088,670 | B1* | 10/2018 | Hester | G02B 26/0833 |
| 2006/0044093 | A1 | 3/2006 | Ohta et al. | |
| 2006/0126151 | A1* | 6/2006 | Aksyuk | G02B 26/0841 |
| | | | | 359/291 |
| 2006/0291129 | A1* | 12/2006 | Chappaz | G02B 26/0841 |
| | | | | 361/207 |
| 2007/0297042 | A1* | 12/2007 | Bifano | G02B 26/02 |
| | | | | 359/318 |
| 2008/0012671 | A1* | 1/2008 | Fortsch | H01H 51/2209 |
| | | | | 335/229 |
| 2008/0037103 | A1* | 2/2008 | Papavasiliou | G02B 26/0841 |
| | | | | 359/291 |
| 2008/0278789 | A1* | 11/2008 | Tanaka | G11B 7/1362 |
| | | | | 359/224.1 |
| 2008/0316563 | A1* | 12/2008 | Aksyuk | B81C 1/00476 |
| | | | | 359/224.1 |
| 2010/0085622 | A1* | 4/2010 | Hofmann | G02B 26/0841 |
| | | | | 359/221.2 |
| 2011/0013300 | A1* | 1/2011 | Wu | G02B 26/0825 |
| | | | | 359/849 |
| 2011/0128521 | A1* | 6/2011 | Weber | H02N 2/023 |
| | | | | 355/67 |
| 2013/0100519 | A1* | 4/2013 | Daniel | H05B 33/12 |
| | | | | 359/290 |
| 2014/0085740 | A1* | 3/2014 | Rooms | G02B 26/06 |
| | | | | 359/846 |
| 2014/0091646 | A1* | 4/2014 | Schiepp | H01L 41/12 |
| | | | | 310/26 |
| 2015/0131135 | A1* | 5/2015 | Reinmuth | H02N 1/008 |
| | | | | 359/221.2 |
| 2016/0204716 | A1* | 7/2016 | Suzuki | B81B 3/0054 |
| | | | | 359/230 |
| 2016/0377858 | A1* | 12/2016 | Hester | G02B 26/0841 |
| | | | | 359/221.2 |
| 2019/0039881 | A1* | 2/2019 | Starman | G02B 26/0841 |
| 2019/0304651 | A1* | 10/2019 | Laufenberg | H01F 1/0308 |
| 2020/0111633 | A1* | 4/2020 | Schautzgy | H01H 37/323 |
| 2020/0211418 | A1* | 7/2020 | Greiner | G09B 21/004 |

FOREIGN PATENT DOCUMENTS

| | | |
|---|---|---|
| JP | H09-317420 A | 12/1997 |
| WO | 2004/078367 A1 | 9/2004 |
| WO | 2008/139034 A1 | 11/2008 |

OTHER PUBLICATIONS

International Preliminary Report on Patentability dated Oct. 23, 2018 issued in corresponding international patent application No. PCT/EP2017/059198.

International Search Report dated Jul. 21, 2017 issued in corresponding international patent application No. PCT/EP2017/059198.

* cited by examiner

ACTUATOR DEVICE AND METHOD FOR OPERATING AN ACTUATOR DEVICE

CROSS REFERENCE TO RELATED APPLICATIONS

This application is a U.S. national stage application of PCT/EP2017/059198 filed on Apr. 18, 2017, which is based on German Patent Application No. 10 2016 107 461.6 filed on Apr. 22, 2016, the contents of which are incorporated herein by reference.

STATE OF THE ART

The invention is based on an actuator device according to the preamble of claim 1 and on a method for operating an actuator device according to claim 18.

From the state of the art actuator devices are known with actuator elements which are moved by way of a shape-memory material.

Moreover an actuator device with an actuator element, which is embodied as an armature element, and with a shape-memory element, which is implemented of a magnetic shape-memory alloy material (also known as MSM material, i.e. Magnetic Shape Memory material), is known from WO 2015/007416 A2.

The objective of the invention is in particular to provide a generic actuator device having improved characteristics regarding an efficiency. The objective is achieved by the characterizing features of patent claim 1 and by the features of patent claim 18 while advantageous implementations and further developments of the invention may be gathered from the subclaims.

Advantages of the Invention

The invention is based on an actuator device with at least one stationary unit, with at least one electromagnetic actuator element which is movable relative to the stationary unit, and with at least one shape-memory element which is implemented at least partly, preferably at least to a large extent and particularly preferably completely of a shape-shiftable shape-memory material.

It is proposed that the shape-memory element is configured, in at least one operation state, to at least partly and advantageously completely hinder a movement of the actuator element in a first movement direction, advantageously an expansion direction, of the shape-memory element, and in a second movement direction that differs from the first movement direction, advantageously a compression direction, of the shape-memory element, at least via a mechanical deformation, advantageously a purely mechanical deformation. "Configured" is in particular to mean specifically designed and/or equipped. By an object being configured for a certain function is in particular to be understood that the object fulfills and/or executes said certain function in at least one application state and/or operation state. The term "at least to a large extent" is here in particular to mean in particular by at least 55%, advantageously by at least 65%, preferably by at least 75%, particularly preferably by at least 85% and especially advantageously by at least 95%.

An "actuator device" is in particular to mean, in this context, at least a portion, in particular a sub-assembly group, of an actuator. The actuator device is advantageously configured at least for a usage in a valve, in particular a poppet valve and/or a slide valve, and/or in a positioning system, in particular an optical positioning system, in particular for a positioning of optical structural elements like, for example, mirrors, lenses and/or other optical elements. The stationary unit is advantageously implemented as an accommodation unit and/or as a holding unit, and is in particular configured to at least partly accommodate, hold and/or support at least the actuator element and/or the shape-memory element. The stationary unit may herein, for example, be at least partially realized as an enclosure, as a housing, as a stator and/or as a flux-conducting member, in particular a ferrite core and/or an iron core.

Furthermore, an "electromagnetic actuator element" is in particular to mean an actuator element, which is advantageously embodied as an adjustment element and/or armature element and which is capable of being influenced by a magnetic signal, in particular a magnetic signal of a magnetic field, and which is in particular configured for converting the magnetic signal into a movement, in particular a rotational movement, a pivot movement and/or preferentially a linear movement. In particular, the actuator element is herein at least partly implemented of a magnetically active, in particular a magnetic and/or magnetizable material, and advantageously of a material that is different from the shape-memory element. Preferably the actuator element is embodied in a one-part implementation. The actuator element is furthermore preferably movable into at least two different, advantageously at least temporarily stable, locations and/or adjustment positions. Especially preferentially the actuator element is movable into at least three, advantageously at least four and particularly preferably any number of different, advantageously at least temporarily stable, locations and/or adjustment positions. By an object "influencing" a further object is in particular to be understood, in this context, that in case of an absence of the object, the further object has and/or assumes a different state and/or a different location than in case of a presence of the object. "In a one-part implementation" is furthermore in particular to mean at least connected by substance-to-substance bond and/or embodied together. The substance-to-substance bond may be established, for example, by an adhesive-bonding process, an injection-molding process, a welding process, a soldering process and/or any other process. Advantageously, however, "in a one-part implementation is to mean formed of one piece and/or in one piece.

Moreover, a "shape-memory element" is in particular to mean an, in particular at least partially, shape-shiftable element, which has at least one shape that is at least temporarily stable and which is advantageously configured to change its shape, advantageously at least a longitudinal extension, depending on at least one external stimulus like, for example, an electrical signal, a thermal signal, a magnetic signal and/or advantageously at least a mechanical signal. Herein a volume of the shape-memory element is preferentially constant. Following a deactivation of the external stimulus, the shape-memory element especially preferentially remains in its current shape and/or position—in particular at least temporarily—and/or in a state in which no external force that differs from a pure gravitational force and/or from an environment pressure, and/or only an external force that is below a limit value, acts onto the shape-memory element. Preferably the shape-memory element is embodied in a one-part implementation. The shape-memory element is furthermore advantageously arranged in a proximity of the actuator element. A "longitudinal extension" of an object, in particular of an elongate object, is in particular to mean, in this context, a maximum extension of the object. Furthermore, a "proximity" is in particular to mean, in this context, a spatial region that is implemented of points which are distanced from a reference point and/or a reference component, in particular the actuator element, by less than a third, preferably less than a quarter, preferentially less than a sixth and particularly preferably less than a tenth of a minimum longitudinal extension of the shape-memory element, and/or which respectively have a distance from a reference point and/or a reference component, in particular the actuator element, of maximally 20 mm, preferentially no more than 10 mm and especially preferentially no more than 5 mm. The term "the shape-memory is configured to hinder a movement of the actuator element" is in particular to mean that the shape-memory element is configured to act counter to a movement of the actuator element and/or to dampen a movement of the actuator element. Such an implementation allows providing an actuator device with improved characteristics regarding an efficiency, in particular an energy efficiency, a structural-component efficiency, a construction-space efficiency and/or a cost efficiency. Beyond this it is advantageously possible to obtain an actuator device with a stiffness that is greater than a stiffness in particular of conventional electromagnetic actuators, in particular reluctance actuators. Furthermore, advantageously a heat production like, for example, in case of a usage of electromagnets, is reducible and/or is advantageously entirely avoidable. It is moreover advantageously possible to provide a particularly compact actuator device and/or to improve an adjustment function wherein, in at least one operating state, in particular an energy-free multi-stability is realizable.

Preferentially, in particular at least in the operating state, the shape-memory element is transferable from an at least temporarily stable first shape into at least one at least temporarily stable second shape by means of the mechanical deformation, and is advantageously configured to maintain the actuator element, in particular at least temporarily, in at least one first location and/or adjustment position, in the first shape and, in at least one second location and/or adjustment position, in the second shape. This allows implementing in particular an advantageous adjustment function.

If the shape-memory element is transferable into at least one at least temporarily stable third shape, and is in particular configured to maintain the actuator element, in particular at least temporarily, in at least one third location and/or adjustment position, in the third shape, it is possible to achieve in particular an advantageous multi-stability.

It is further proposed that the shape-memory element is connected, in particular non-releasably connected, with the actuator element and/or with the stationary unit. Herein the shape-memory element preferably contacts the actuator element and/or the stationary unit directly. This in particular allows achieving an advantageous force transfer between the stationary unit, the shape-memory element and the actuator element.

In a preferred implementation of the invention it is proposed that the shape-memory element is connected to the actuator element and/or to the stationary unit via a clamp connection, in particular a crimp connection and/or flanged connection, via a glue connection, via a socketing connection and/or a welding connection, in particular a laser welding connection. This in particular allows achieving a secure and/or stable connection. It is moreover advantageously possible to ensure that the shape-memory element is damaged and/or mechanically blocked, if at all, only locally, as a result of which in particular a functionality of the shape-memory element can be maintained.

Preferably the second movement direction is oriented counter to the first movement direction. The actuator element may herein be movable at least partially in a rotary fashion like, for example, following a tilt-armature principle. Advantageously, however, the actuator element is embodied in such a way that it is linearly movable. In this way in particular an advantageously simple mobility, in particular adjustment movement and/or lifting movement, of the actuator element is achievable.

It is also proposed that a maximum movement distance of the actuator element along at least one direction, in particular along the first movement direction and/or the second movement direction, is equivalent to at least 1%, advantageously at least 2.5% and particularly preferably at least 5%, and/or equivalent to maximally 20% and advantageously no more than 15% of a minimum extension of the shape-memory element along the direction, advantageously along a longitudinal extension of the shape-memory element. In this way in particular an advantageous adjustment movement is achievable. Moreover it is in particular possible to improve a functionality of the actuator device.

The actuator device advantageously further comprises at least one magnetic setting unit, which is advantageously actively actuatable and which is configured to effect, in particular by means of an adjustment magnetic field, a movement of the actuator element, in particular in the first movement direction and/or in the second movement direction. In particular, the magnetic setting unit is configured to provide and/or advantageously to generate the adjustment magnetic field. Advantageously the magnetic setting unit herein comprises an operative connection to at least one supply electronics unit. The actuator device may herein in particular comprise the supply electronics unit. The magnetic setting unit could herein in particular be embodied as a permanent magnet and may, for example, be supported in such a way that it is movable relative to the actuator element and/or to the shape-memory element. Advantageously, however, the magnetic setting unit is implemented as a coil system, advantageously with at least one coil and/or with at least one electromagnet. This in particular allows an advantageously simple movement of the actuator element. Moreover, it is in particular possible to advantageously optimize a construction-space efficiency, a structural-component efficiency, an energy efficiency and/or a cost efficiency.

Furthermore it is proposed that the shape-memory material is implemented at least partly, preferably at least to a large extent and particularly preferably entirely, of a nickel-titanium alloy, an alloy containing nickel and titanium, a nickel-manganese-gallium alloy, a nickel-manganese-gallium containing alloy, a copper-zinc-aluminum alloy and/or a copper-aluminum-nickel alloy. This in particular allows minimizing costs and/or improving an effectivity.

The shape-memory material is preferably implemented as a composite material, in particular comprising components embodied of nickel, titanium, manganese, gallium, copper, zinc and/or aluminum, which are embodied in a matrix like, for example, a metal matrix, a polymer matrix and/or a ceramic matrix. In this way in particular an especially high degree of stiffness and/or movement-damping effect are/is achievable.

The shape-memory material could, for example, be a thermally active material. Preferentially, however, the shape-memory material is a magnetically active material, in particular a magnetic shape-memory material, as a result of which in particular an advantageously simple influence on the shape-memory material and in particular on the shape-memory element is achievable. Particularly preferably the shape-memory material is herein implemented as a magnetic shape-memory alloy (also known as an MSM material=Magnetic Shape Memory material).

It is moreover proposed that the actuator device comprises at least one magnet unit, which is advantageously actively actuatable and which is configured, in at least one further operating state, to influence a shape of the shape-memory element, in particular via a magnetic field. In particular, the magnet unit is configured to provide and/or advantageously generate the magnetic field. Advantageously the magnet unit herein comprises an operative connection with at least one further supply electronics unit. In particular, the actuator device may comprise the further supply electronics unit. Preferentially the further supply electronics unit is identical to the supply electronics unit. The magnet unit could herein in particular be embodied as a permanent magnet and could, for example, be supported to be movable relative to the shape-memory element and/or to the actuator element. Advantageously, however, the magnet unit is implemented as a coil system, advantageously with at least one coil and/or with at least one electromagnet. Particularly preferably the magnet unit and the magnetic setting unit are at least partially identical to one another. In particular, the further operating state may principally also be equivalent to the operating state. This in particular allows an adjustment of a stiffness of the shape-memory element, and thus in particular of a mechanical holding force and/or damping force of the shape-memory element. It is advantageously further possible to achieve an adjustment and/or alignment of the shape-memory element.

Beyond this it is proposed that the magnet unit is configured, in the further operating state, to effect a deformation of the shape-memory element via a shape-shift magnetic field, and that the shape-memory element is configured to at least partly hinder a movement of the actuator element in the first movement direction and/or in the second movement direction by means of the magnetic deformation, the magnetic deformation advantageously cooperating with the mechanical deformation of the shape-memory element. Furthermore it is advantageously proposed that the magnet unit is configured, in the further operating state, to bring about a deformation of the shape-memory element by means of a further shape-shift magnetic field, and that the shape-memory element is configured to bring about a movement of the actuator element in the first movement direction and/or in the second movement direction by means of the magnetic deformation. This allows realizing an advantageous control and/or adjustment of the actuator device.

In a preferred implementation of the invention it is further proposed that the actuator device comprises at least one securing unit, which is configured, in at least one error operating state, for example, in case a certain temperature is exceeded, in case of a defect or break-down of a structural component of the actuator device like, for example, the supply electronics unit and/or the actuator element, and/or in case of a power failure, to bring about a movement of the actuator element and/or of the shape-memory element into a defined shape and/or location. Herein the securing unit may in particular comprise at least one power storage element, e.g. an accumulator, a battery and/or a capacitor, in particular for the purpose of effecting a movement of the actuator element and/or of the shape-memory element in the error operating state. This allows in particular improving an operational reliability. It is moreover possible to realize an advantageous fail-safe function and/or an emergency shut-down.

Furthermore a method for an operation of an actuator device is proposed, wherein in at least one operating state a movement, in particular of an electromagnetic actuator element, in a first movement direction, advantageously an expansion direction, of the shape-memory element, and in a second movement direction that differs from the first movement direction, advantageously a compression direction, of the shape-memory element, is at least partially, advantageously completely hindered at least via an, advantageously purely, mechanical deformation, of a shape-shiftable shape-memory material. This in particular allows improving an efficiency, in particular an energy efficiency, a structural-component efficiency, a construction-space efficiency and/or a cost efficiency. It is moreover advantageously possible to achieve an actuator device having a stiffness that is augmented, in particular as compared to conventional electromagnetic actuators, in particular reluctance actuators. It is also advantageously possible to reduce and/or advantageously completely avoid a heat production like, for example, with a usage of electromagnets. It is furthermore possible to advantageously provide an especially compact actuator device and/or to improve an adjustment function, wherein, in at least one operating state, in particular an energy-free multi-stability is realizable.

The actuator device and the method for operating the actuator device are herein not to be limited to the application and implementation described above. In particular, for the purpose of implementing a functionality that is described here, the actuator device and the method for operating the actuator device may comprise a number of respective elements, structural components and units that differs from a number that is mentioned here.

DRAWINGS

Further advantages will become apparent from the following description of the drawings. The drawings show exemplary embodiments of the invention. The drawings, the description and the claims contain a plurality of features in combination. Someone skilled in the art will purposefully also consider the features separately and will find further expedient combinations.

Figure 2A:
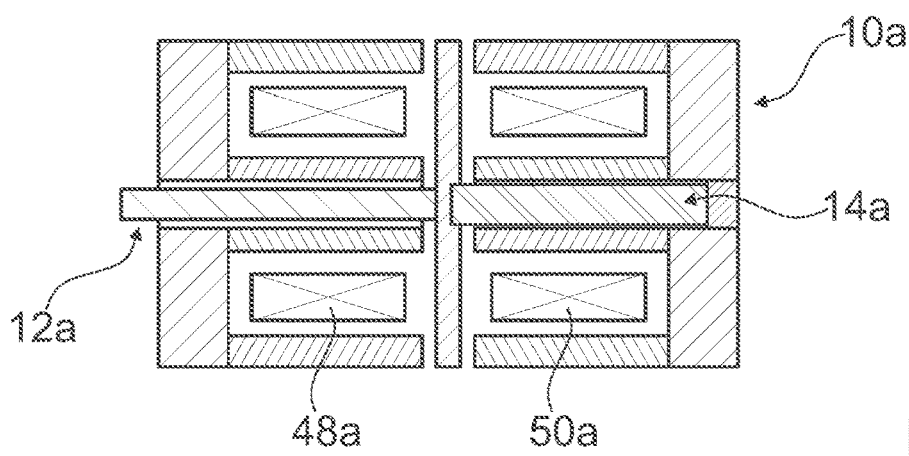
Figure 2B:
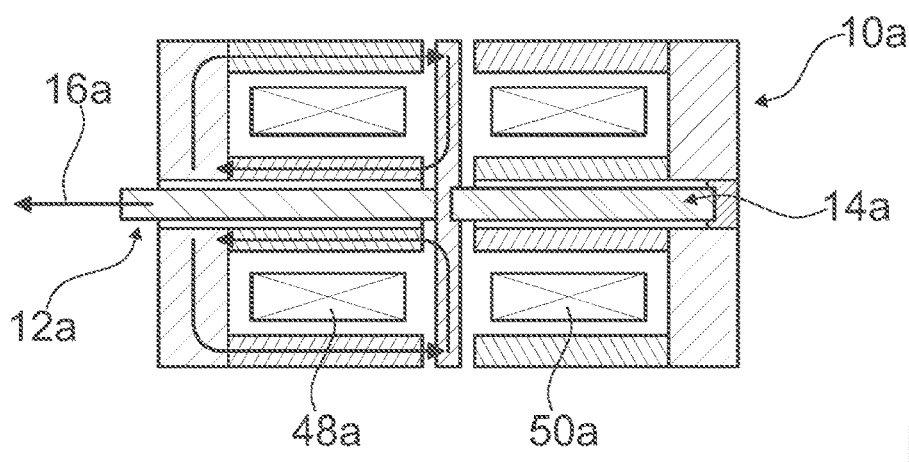
Figure 2C:
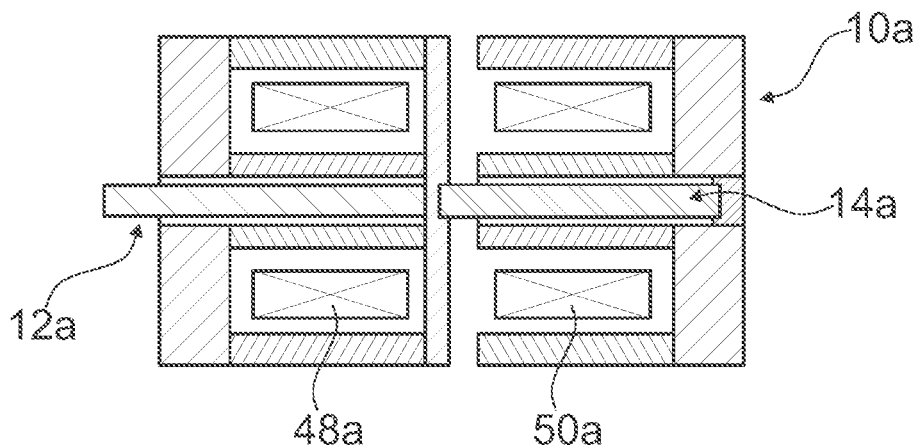
Figure 2D:
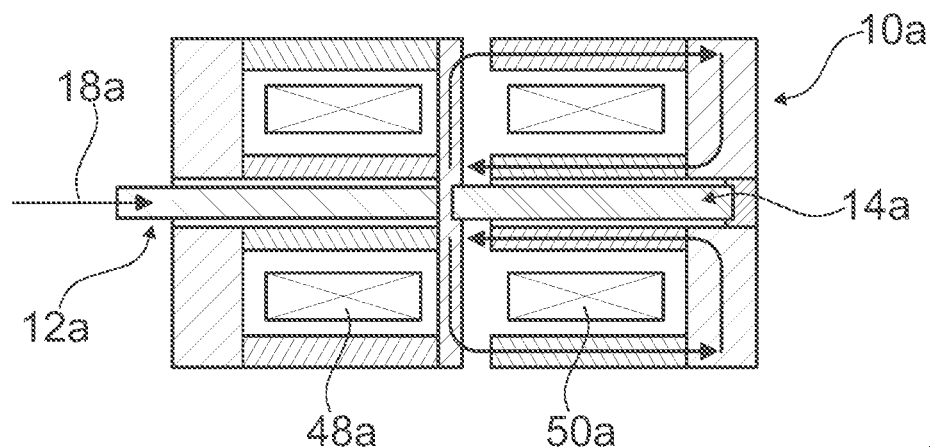
Figure 2E:
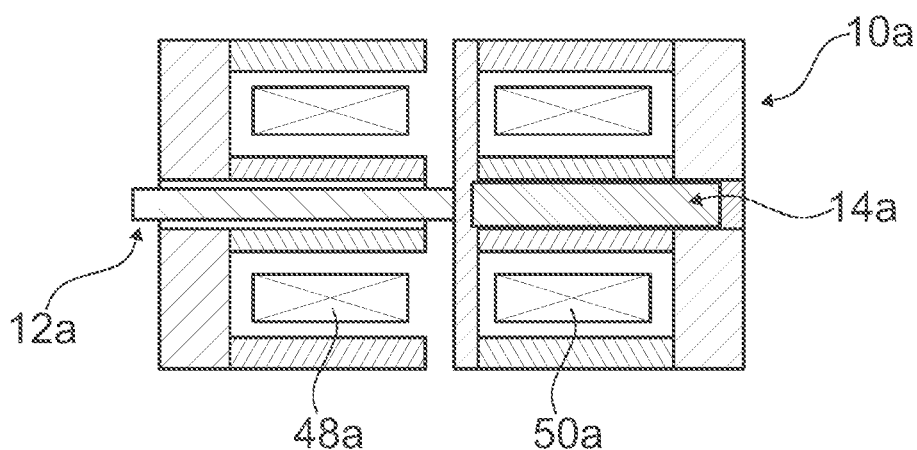
Figure 3:
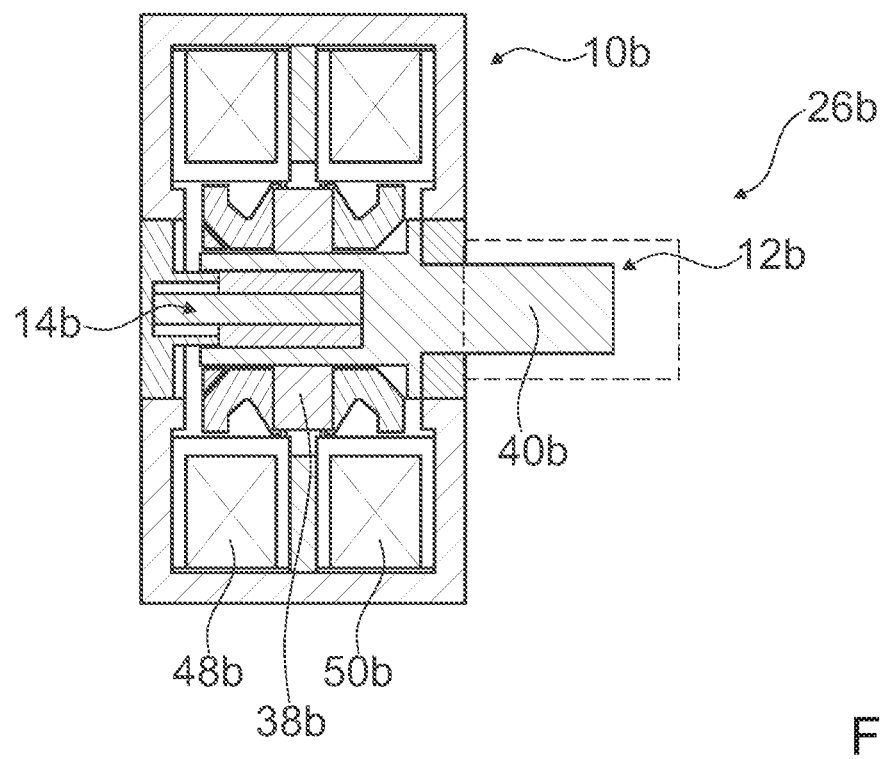
Figure 4:
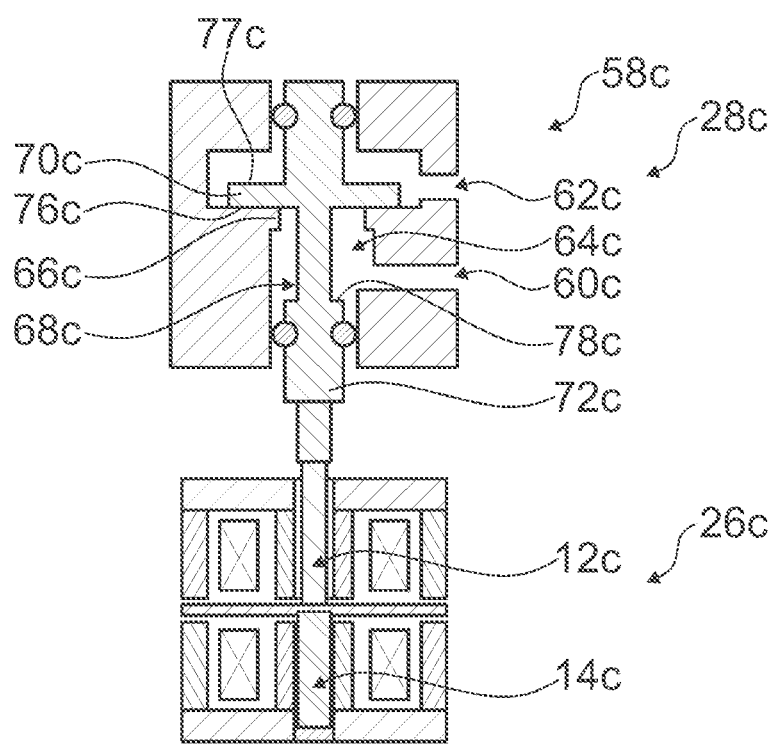
Figure 5:
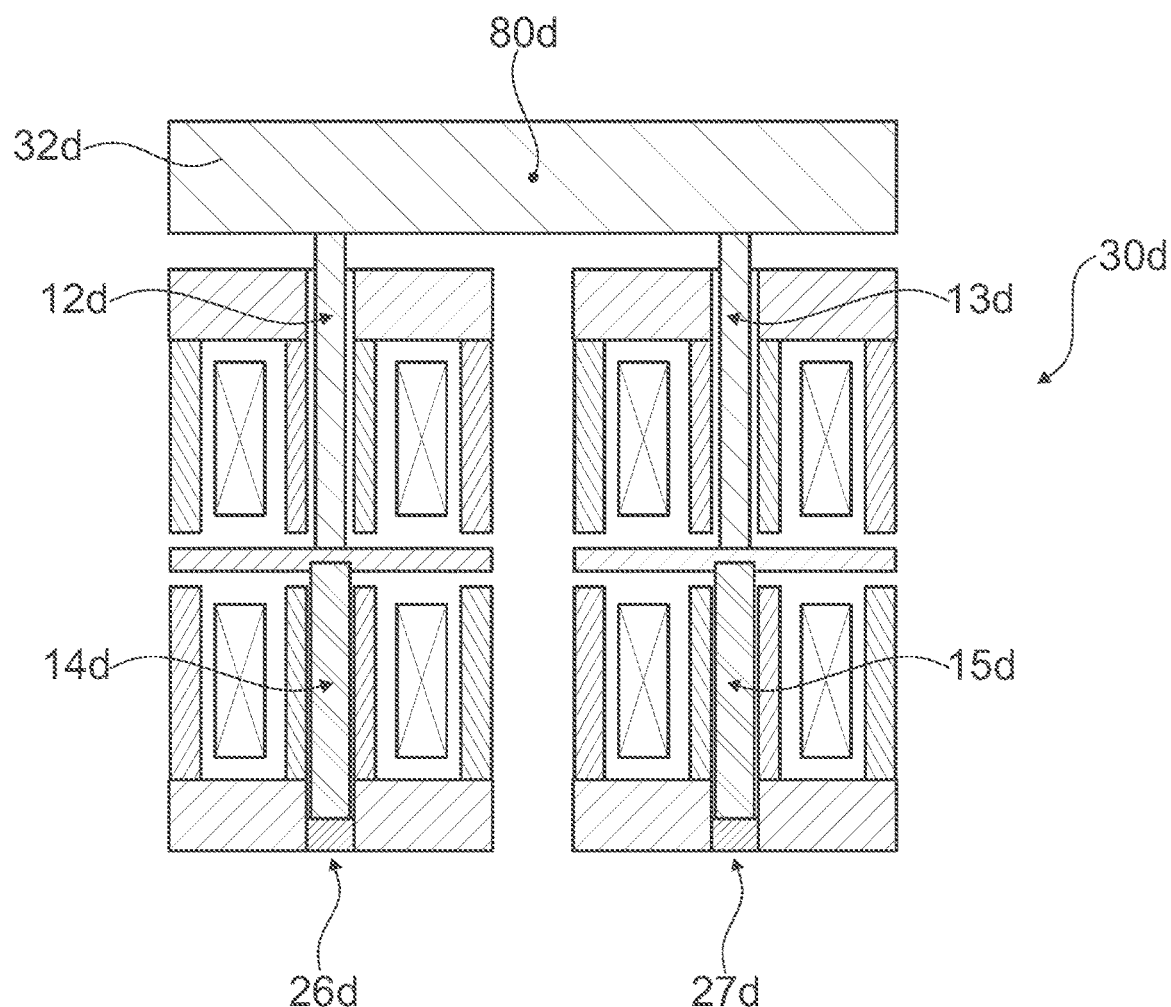

It is shown in:

FIG. 1 an actuator with an actuator device, in a schematic side view,

FIGS. 2a-e the actuator with the actuator device, in different operating states, FIG. 3 a further actuator with a further actuator device, in a schematic side view, FIG. 4 a valve with a further actuator device, in a schematic side view, and FIG. 5 a positioning system with at least one further actuator device, in a schematic side view.

DESCRIPTION OF THE EXEMPLARY EMBODIMENTS

FIG. 1 shows an exemplary actuator 26a with an actuator device, in a schematic view.

The actuator device comprises a stationary unit 10a. The stationary unit 10a is implemented as an accommodation unit. The stationary unit 10a is configured to accommodate and/or support at least a large portion of the structural components which are necessary for an operation of the actuator device. Furthermore, in the present case the stationary unit 10a is embodied in an at least two-part implementation. The stationary unit 10a herein comprises two stationary elements 34a, 36a. The stationary elements 34a, 36a are at least substantially identical to one another. The stationary elements 34a, 36a are embodied at least substantially W-shaped and/or E-shaped. The stationary elements 34a, 36a are arranged spaced apart from one another, as a result of which there is in particular a free space between the stationary elements 34a, 36a. The stationary elements 34a, 36a are furthermore arranged mirror-symmetrically to one another. The stationary elements 34a, 36a are arranged in such a way that they delimit a shared accommodation region.

Furthermore the stationary unit 10a is implemented at least partly as a flux-conducting member, and in particular forms at least a portion of at least one magnetic circuit. The stationary unit 10a is herein configured to at least partially guide and/or amplify a magnetic field. In the present case the stationary elements 34a, 36a are respectively embodied as a ferrite core. Alternatively it is conceivable to realize a stationary unit as a holding unit, as a delimitation unit and/or as a housing, in particular an inner housing and/or an outer housing. The stationary unit could moreover be embodied in a one-part implementation. A stationary unit could principally also be implemented differently than a flux-conducting member.

Beyond this the actuator device comprises at least one actuator element 12a. In the present case the actuator device comprises precisely one actuator element 12a. The actuator element 12a is embodied in a one-part implementation. The actuator element 12a is embodied as an adjustment element. The actuator element 12a is moreover implemented as an armature element. The actuator element 12a moreover has a T-shaped cross section. The actuator element 12a is arranged, at least to a large portion, within the stationary unit 10a, in particular within the accommodation region. Herein the actuator element 12a is supported movably with respect to the stationary unit 10a. In the present case the actuator element 12a is movable in a first movement direction 16a and in a second movement direction 18a that is oriented counter to the first movement direction 16a (cf. also FIGS. 2a-2e).

The actuator element 12a is further implemented as an electromagnetic actuator element. The actuator element 12a is implemented at least partly of a magnetically active, in particular a magnetic and/or magnetizable, material. The actuator element 12a is thus movable by means of a magnetic field.

An adjustment section 38a of the actuator element 12a, in particular a transverse beam of the T-shaped cross section, which in particular has two free ends, is arranged between the stationary elements 34a, 36a. The adjustment section 38a is herein arranged in the free space. The adjustment section 38a is in the present case arranged entirely within the stationary unit 10a. The adjustment section 38a serves for a movement of the actuator element 12a. The adjustment section 38a is herein embodied as a flux-conducting member and is in particular configured to cooperate with the magnetic circuit of the stationary unit 10a in at least one operating state. Furthermore lateral surfaces of the stationary elements 34a, 36a, which delimit the free space, define abutment surfaces 42a, 44a for the adjustment section 38a. The abutment surfaces 42a, 44a are arranged in parallel to each other. The actuator element 12a and in particular the adjustment section 38a is/are freely movable between the abutment surfaces 42a, 44a. A distance of the abutment surfaces 42a, 44a delimits a maximum movement distance of the actuator element 12a. In the present case the actuator element 12a is herein movable into a plurality of different adjustment positions, in particular between the abutment surfaces 42a, 44a.

An actuation section 40a of the actuator element 12a, in particular a longitudinal beam of the T-shaped cross section, which in particular has a free end, projects out of the stationary unit 10a. The actuation section 40a is arranged perpendicularly to the adjustment section 38a. The actuation section 40a is configured for an operation, for a drive, for a positioning and/or for an adjustment of at least one structural component. Principally however an actuator device could also comprise a different number of actuator elements like, for example, at least two actuator elements and/or at least three actuator elements. It is moreover conceivable to realize an actuator element in a multi-part implementation. Beyond this, an actuator element could principally also be implemented in a monostable or in a bistable manner. An actuator element could furthermore also be implemented at least substantially I-shaped and/or L-shaped.

For the purpose of a movement of the actuator element 12a, the actuator device comprises a magnetic setting unit 20a. The magnetic setting unit 20a is arranged in a proximity of the actuator element 12a. The magnetic setting unit 20a is actively actuatable. The magnetic setting unit 20a has an operative connection with a supply electronics unit 46a of the actuator device. The magnetic setting unit 20a is configured to generate at least one adjustment magnetic field.

For this purpose the magnetic setting unit 20a is embodied as a coil system. The magnetic setting unit 20a comprises in the present case two inductivities 48a, 50a. The inductivities 48a, 50a are at least substantially identical to one another. The inductivities 48a, 50a are in the present case each embodied as a coil. The inductivities 48a, 50a respectively comprise an electrical connection with the supply electronics unit 46a. The inductivities 48a, 50a are completely arranged within the stationary unit 10a, in particular within the accommodation region. A first inductivity 48a of the inductivities 48a, 50a is herein allocated to a first stationary element 34a of the stationary elements 34a, 36a. A second inductivity 50a of the inductivities 48a, 50a is allocated to a second stationary element 36a of the stationary elements 34a, 36a. The stationary elements 34a, 36a are herein configured to at least partly guide magnetic field lines of the inductivities 48a, 50a, thus advantageously at least partly augmenting a field strength of the inductivities 48a, 50a. The inductivities 48a, 50a are moreover arranged on different sides of the adjustment section 38a. The first inductivity 48a is arranged on a side of the adjustment section 38a that faces towards the actuation section 40a. The second inductivity 50a is arranged on a side of the adjustment section 38a that faces away from the actuation section 40a.

The first inductivity 48a is in the present case configured, if a current is applied and in particular by means of a thus generated first adjustment magnetic field, to bring about a movement of the adjustment section 38a, and thus in particular of the actuator element 12a, in the first movement direction 16a. Furthermore the second inductivity 50a is configured, if a current is applied and in particular by means of a thus generated second adjustment magnetic field, to bring about a movement of the adjustment section 38a, and thus in particular of the actuator element 12a, in the second movement direction 18a. Alternatively a magnetic setting unit could also comprise different types of inductivities and/or a different number of inductivities, for example at least three and/or at least four inductivities.

The actuator device furthermore comprises at least one shape-memory element 14a. In the present case the actuator device comprises precisely one shape-memory element 14a. Principally, however, an actuator device could also comprise a different number of shape-memory elements, e.g. at least two and/or at least three shape-memory elements, which may in particular be arranged in parallel and/or serially with respect to each other.

The shape-memory element 14a is arranged, at least to a large portion, within the stationary unit 10a, in particular within the accommodation region. The shape-memory element 14a is herein arranged on that side of the adjustment section 38a that faces away from the actuation section 40a. The shape-memory element 14a is arranged in a proximity of the second inductivity 50a. In the present case the shape-memory element 14a is arranged in a central region of the second inductivity 50a. The shape-memory element 14a is furthermore embodied in a one-part implementation. The shape-memory element 14a is embodied at least substantially rectangular-cuboid-shaped. The shape-memory element 14a is embodied in an elongate fashion, having a longitudinal extension that is in particular arranged horizontally in FIG. 1. The longitudinal extension of the shape-memory element 14a is herein oriented in parallel to a longitudinal extension of the actuation section 40a. In the present case the shape-memory element 14a and the actuation section 40a are arranged, one behind the other one, on a shared straight line.

The shape-memory element 14a furthermore contacts the stationary unit 10a directly. In the present case at least a first end face of the shape-memory element 14a contacts the stationary unit 10a directly. The shape-memory element 14a is herein connected with the stationary unit 10a, in the present case in particular by a laser welding connection. The shape-memory element 14a moreover contacts the actuator element 12a directly. In the present case a second end face of the shape-memory element 14a, which is in particular situated opposite the first end face, contacts the adjustment section 38a of the actuator element 12a directly. The shape-memory element 14a is herein connected with the actuator element 12a, in particular by a laser welding connection. In the present case a maximum movement distance of the actuator element 12a in the first movement direction 16a and in the second movement direction 18a is equivalent to at least 5% of the longitudinal extension of the shape-memory element 14a. Furthermore a maximum movement distance of the actuator element 12a in the first movement direction 16a and in the second movement direction 18a is equivalent to maximally 20% of the longitudinal extension of the shape-memory element 14a. A huge expansion of the shape-memory element 14a is herein advantageous, allowing usage of a shape-memory element 14a that is as short as possible with a given stroke of the actuator 26a. It is alternatively conceivable to connect a shape-memory element to a stationary unit and/or to an actuator element by a different connection method like, for example, by a clamp connection and/or glue connection or the like. Beyond this, a connection method for connecting a shape-memory element to a stationary unit could differ from a connection method for connecting the shape-memory element to an actuator element. A shape-memory element could principally also be connected to an actuator element and/or to a stationary unit in an indirect manner.

The shape-memory element 14a is further implemented in a shape-shiftable fashion. The shape-memory element 14a is implemented of a shape-shiftable shape-memory material. The shape-memory material is in the present case equivalent to a magnetically active material, in particular a magnetic shape-memory material. The shape-memory element 14a is herein implemented of a nickel-manganese-gallium alloy. The shape-memory element 14a is furthermore embodied as a mono-crystal. Alternatively, however, a shape-memory element could be implemented of an alloy containing nickel, manganese and gallium, a nickel-titanium alloy, an alloy containing nickel and titanium, a copper-zinc-aluminum alloy and/or a copper-aluminum-nickel alloy. A shape-memory element could moreover be implemented as a foam, as a poly-crystal and/or as a composite material, wherein nickel components, manganese components and gallium components may be embedded in a matrix. Principally a shape-memory element could furthermore also be implemented of a magnetostrictive material and/or of a thermally active shape-memory material.

The shape-shiftable shape-memory material has the feature that, as a reaction to a mechanical force with a defined minimum strength and a defined direction, there is a shape shift, in particular a mechanical shape shift, in particular an expansion or compression movement in a direction of a longitudinal extension of the shape-memory element 14a. The shape-memory element 14a herein acts at least partly counter to the mechanical force and/or to a mechanical load, thus resulting—to a certain extent—in a damping, in particular a velocity-independent damping, of the mechanical force. An actuator with an actuator device according to the invention could thus principally also be equipped as a damper. However, subsequently to a reduction and/or interruption of the mechanical force and/or the mechanical load, a movement back into a basis shape and/or original shape does not necessarily take place. On the contrary, even subsequently to the reduction and/or interruption of the mechanical force and/or mechanical load, the shape-memory element 14a remains in its current, in particular expanded and/or compressed, shape, in particular at least in a state in which merely a small external force, and/or no external force that differs from a pure gravitational force and/or from an environment pressure, acts onto the shape-memory element 14a. For a shape shift of the shape-memory element 14a it is herein necessary to overcome an internal force of the shape-memory element 14a, which is in the present case due to a relatively high hysteresis of the material used.

Moreover, the material used is in the present case a magnetically active material, in particular a magnetic shape-memory material. This material additionally has the characteristic that, as a reaction to an applied magnetic field with a defined minimum field strength and a defined direction, also a shape shift, in particular an expansion or compression movement, takes place in a direction of the longitudinal extension of the actuator element 12a. In this case as well, a reduction and/or a deactivation of the magnetic field is not necessarily followed by a movement back into the basis shape and/or original shape, and the shape-memory element 14a therefore also remains in its current, in particular expanded and/or compressed, shape, in particular at least in a state in which only a small external force, and/or no external force that differs from a pure gravitational force and/or from an environment pressure, acts onto the shape-memory element 14a. It is herein in particular possible, by means of an electromagnet and/or a permanent magnet, that a counter force and/or holding force is generated counter to an external force, in particular to a reset force and/or a tension force, as a result of which advantageously a damping effect and/or a current shape of the shape memory element 14a are/is adjustable.

The shape-memory element 14a is in the present case configured, in at least one operating state, to hinder a movement of the actuator element 12a, in particular brought about by means of the magnetic setting unit 20a, in the first movement direction 16a which is in the present case in particular equivalent to an expansion direction of the shape-memory element 14a, and in the second movement direction 18a which is in the present case in particular equivalent to a compression direction of the shape-memory element 14a, by way of a purely mechanical deformation. The shape-memory element 14a is herein transferable from a stable first shape into at least one stable second shape via a mechanical force of the actuator element 12a. Beyond this, the shape-memory element 14a is configured to hold the actuator element 12a in its first shape in at least one first adjustment position and in its second shape in at least one second adjustment position. Furthermore the shape-memory element 14a is implemented in a multi-stable manner, and is in the present case transferable into a plurality of further shapes, in particular at least a third shape, in particular by means of the mechanical force of the actuator element 12a. The shape-memory element 14a is herein configured to maintain the actuator element 12a in an adjustment position in each of the further shapes.

The actuator device moreover comprises in the present case an, in particular additional, magnet unit 22a. The magnet unit 22a is configured, in at least one further operating state, to influence a shape of the shape-memory element 14a, in particular via a magnetic field.

For this purpose the magnet unit 22a is implemented as a coil system. The magnet unit 22a has an operative connection with the shape-memory element 14a. In the present case the magnet unit 22a is at least partially identical with the magnetic setting unit 20a. The second inductivity 50a is herein part of the magnet unit 22a. This in particular allows providing an especially compact and/or energy-efficient actuator device.

In the present case the magnet unit 22a is configured, in the further operating state, to effect a deformation of the shape-memory element 14a via a shape-shift magnetic field, in such a way that the shape-memory element 14a is configured to at least partly hinder a movement of the actuator element 12a in the first movement direction 16a and in the second movement direction 18a by means of the magnetic deformation. Herein the magnetic deformation advantageously cooperates with the mechanical deformation of the shape-memory element 14a, thus in particular allowing a setting of a damping hardness of the shape-memory element 14a.

The magnet unit 22a may also be configured, in the further operating state, to load the shape-memory element 14a with a further shape-shift magnetic field in such a way that a movement of the actuator element 12a in the first movement direction 16a and/or the second movement direction 18a is brought about by way of a shape shift of the shape-memory element 14a, as a result of which, for example, a pre-positioning of the shape-memory element 14a is achievable. Alternatively it is conceivable to realize a magnet unit completely separately from a magnetic setting unit. The magnet unit could in such a case in particular also comprise at least two, at least three and/or at least four inductivities like, for example, coils and/or electromagnets. Furthermore a magnet unit, in particular an additional magnet unit, could principally also be dispensed with. In the latter case a magnetic field for influencing a shape-memory element could principally also correspond to a magnetic field acting onto an actuator from a surrounding region.

The actuator device moreover comprises in the present case a securing unit 24a. The securing unit 24a herein provides a fail-safe function, as a result of which an emergency shut-down of the actuator 26a and/or at least of the actuator device may be realized. The securing unit 24a is configured, in at least one error operating state, e.g. in case a given temperature is exceeded, in case of a defect or breakdown of a component of the actuator device like, for example, of the supply electronics unit 46a and/or of the actuator element 12a, and/or in case of a power breakdown, to bring about a movement of the actuator element 12a into a defined adjustment position. In the present case the securing unit 24a is in the error operating state configured to actuate the magnetic setting unit 20a for the purpose of moving the actuator element 12a into a defined adjustment position by means of an adjustment magnetic field. For this the securing unit 24a has an electrical connection to the magnetic setting unit 20a. Alternatively however, a securing unit could also be configured for a movement of a shape-memory element and could, for example, have an operative connection with a magnet unit. It is further conceivable, in particular in case a thermally active shape-memory element is used, to realize a thermally induced fail-safe behavior wherein, when a characteristic phase-conversion temperature is exceeded, a shape-memory element is deformed, thus bringing an actuator element into a defined adjustment position.

The securing unit 24a furthermore comprises an energy storage element 52a, which is in the present case in particular implemented as a battery, thus allowing to ensure an operative reliability, in particular also in case of a power breakdown. Alternatively an energy storage element could also be embodied as an accumulator and/or capacitor. Beyond this an energy storage element could also be dispensed with. It is moreover conceivable to entirely do without a securing unit.

FIGS. 2a to 2e show an exemplary switch cycle of the actuator device.

FIG. 2a shows the actuator element 12a in an, in particular exemplary, first adjustment position and the shape-memory element 14a in an, in particular exemplary, first shape. The first adjustment position is in the present case equivalent to a position in which the adjustment section 38a is arranged centrally between the abutment surfaces 42a, 44a. In this operating state the magnetic setting unit 20a and in particular the first inductivity 48a and the second inductivity are non-operated. The actuator element 12a is herein held in the first adjustment position by means of the shape-memory element 14a.

FIG. 2b shows a movement of the actuator element 12a in the first movement direction 16a, in particular an expansion process of the shape-memory element 14a which is correlated with said movement. For the movement of the actuator element 12a in the first movement direction 16a, the first inductivity 48a is here loaded with a direct current by means of the supply electronics unit 46a, as a result of which in particular an adjustment magnetic field for moving the adjustment section 38a is brought about and/or induced. Consequently the shape-memory element 14a is purely mechanically deformed, wherein the movement of the actuator element 12a is hindered by the mechanical deformation. In this operating state the second inductivity 50a is non-operated.

FIG. 2c shows the actuator element 12a in an, in particular exemplary, second adjustment position and the shape-memory element 14a in an, in particular exemplary, second shape. The second adjustment position is in the present case equivalent to a position in which the adjustment section 38a abuts on a first abutment surface 42a of the abutment surfaces 42a, 44a. In this operating state the magnetic setting unit 20a and in particular the first inductivity 48a and the second inductivity 50a are non-operated. The actuator element 12a is here held in the second adjustment position by the shape-memory element 14a.

FIG. 2d shows a movement of the actuator element 12a in the second movement direction 18a, in particular a compression process of the shape-memory element 14a which is correlated to said movement. For a movement of the actuator element 12a in the second movement direction 18a, the second inductivity 50a is here loaded with a direct current via the supply electronics unit 46a, as a result of which in particular a further adjustment magnetic field for moving the adjustment section 38a is brought about and/or induced. The shape-memory element 14a is consequently deformed in a purely mechanical fashion, wherein the movement of the actuator element 12a is hindered by the mechanical deformation. In this operating state the first inductivity 48a is non-operated.

FIG. 2e shows the actuator element 12a in an, in particular exemplary, third adjustment position and the shape-memory element 14a in an, in particular exemplary, third shape. The third adjustment position is in the present case equivalent to a position in which the adjustment section 38a abuts on a second abutment surface 44a of the abutment surfaces 42a, 44a. In this operating state the magnetic setting unit 20a and in particular the first inductivity 48a and the second inductivity 50a are non-operated. The actuator element 12a is herein held in the third adjustment position by the shape-memory element 14a.

In FIGS. 3 to 5 further exemplary embodiments of the invention are shown. The following description and the drawings are substantially limited to the differences between the exemplary embodiments, wherein principally regarding identically denominated structural components, in particular regarding structural components with the same reference numerals, the drawings and/or the description of the other exemplary embodiments, in particular of FIGS. 1 to 2e, may also be referred to. For distinguishing between the exemplary embodiments, the letter a has been added to the reference numerals of the exemplary embodiment in FIGS. 1 to 2e. In the exemplary embodiments of FIGS. 3 to 5 the letter a has been substituted by the letters b to d.

In FIG. 3 another exemplary embodiment of the invention is shown. In the exemplary embodiment of FIG. 3 the letter b has been added. The further exemplary embodiment of FIG. 3 shows a practical example of an actuator 26b corresponding to the preceding exemplary embodiment.

Here FIG. 3 exemplarily illustrates an actuator 26b that is realized as a so-called "moving magnet voice-coil actuator". The actuator device corresponds in this case at least substantially to the actuator device of the preceding exemplary embodiment.

In FIG. 4 a further exemplary embodiment of the invention is shown. In the exemplary embodiment of FIG. 4 the letter c has been added. The further exemplary embodiment of FIG. 4 shows another practical example of an actuator 26c corresponding to the preceding exemplary embodiments.

FIG. 4 illustrates a valve 28c, which is exemplarily realized as a poppet valve. The valve 28c is implemented to be controllable. The valve 28c is implemented as a proportioning valve. The valve 28c is in the present case moreover embodied as a valve working with the support of a fluid pressure. Alternatively it is however also conceivable to realize a valve as a slide valve or as any other type of valve.

The valve 28c comprises a fluid receiving unit 58c. The fluid receiving unit 58c is embodied as a fluid housing. The fluid receiving unit 58c comprises an inlet opening 60c and an outlet opening 62c. The inlet opening 60c is configured for feeding in a fluid flow, which is in the present case in particular a gaseous fluid flow. The outlet opening 62c is configured for conveying the fluid flow out. The fluid receiving unit 58c further defines at least one, in the present case precisely one, fluid line 64c. The fluid line 64c connects the inlet opening 60c with the outlet opening 62c. The fluid line 64c is configured to at least partially convey the fluid flow. The valve 28c and in particular the fluid receiving unit 58c are herein free from a bypass line and/or a pilot valve.

The valve 28c further comprises a valve seat 66c. The valve seat 66c is arranged within the fluid receiving unit 58c. The valve seat 66c herein delimits the fluid line 64c at least partially.

The valve 28c moreover comprises a closure unit 68c. The closure unit 68c is arranged at least to a large extent within the fluid receiving unit 58c. Furthermore the closure unit 68c is arranged at least partially within the fluid line 64c. The closure unit 68c is in an operative connection with the valve seat 66c. The closure unit 68c is embodied to be movable relative to the valve seat 66c. In the present case the closure unit 68c is herein embodied to be linearly movable. The closure unit 68c is configured to cooperate, in a closure position, with the valve seat 66c to close off the fluid line 64c.

For this purpose the closure unit 68c comprises at least one closure element 70c. The closure element 70c is arranged entirely within the fluid line 64c. The closure element 70c is embodied in a one-part implementation. The closure element 70c is embodied to be at least partly saucer-shaped. The closure element 70c is embodied as a throttle element. In the closure position the closure element 70c contacts the valve seat 66c. The closure element 70c is in the closure position fluid-tightly adjacent to the valve seat 66c. For this purpose the closure element 70c may comprise a sealing element, which is in particular arranged in a circumferential direction, which is advantageously elastic. Alternatively it is however also conceivable to implement a closure element in a multi-part fashion and/or at least substantially sphere-shaped.

Beyond this the closure unit 68c comprises a valve tappet 72c. The valve tappet 72c is embodied in a one-part implementation. The valve tappet 72c is made at least partly of a magnetic material. The valve tappet 72c has an operative connection with the closure element 70c. In the present case the valve tappet 72c contacts the closure element 70c directly. Herein the valve tappet 72c is embodied in a one-part implementation with the closure element 70c. The valve tappet 72c has a main extension direction that is arranged perpendicularly to a main extension plane of the closure element 70c. The valve tappet 72c herein projects out of the fluid receiving unit 58c. The valve tappet 72c serves for an, in particular controllable, movement of the closure element 70c. Alternatively a valve tappet could also be embodied in a multi-part implementation and/or separately from a closure element.

The closure unit 68c further comprises, in the present case, a plurality of fluid pressure surfaces 76c, 77c, 78c. In the present case the closure unit 68c comprises at least three fluid pressure surfaces 76c, 77c, 78c. The fluid pressure surfaces 76c, 77c, 78c are arranged perpendicularly to a movement direction of the closure unit 68c. A first fluid pressure surface 76c of the fluid pressure surfaces 76c, 77c, 78c is arranged on a side of the closure element 70c that faces toward the valve seat 66c. A second fluid pressure surface 77c of the fluid pressure surfaces 76c, 77c, 78c is arranged on a side of the closure element 70c that faces away from the valve seat 66c. A third fluid pressure surface 78c of the fluid pressure surfaces 76c, 77c. 78c is molded onto the valve tappet 72c. The third fluid pressure surface 78c faces towards the closure element 70c. Herein all fluid pressure surfaces 76c, 77c, 78c differ from one another by an area portion of at least 10%. Advantageously, however, a total surface area of the second fluid pressure surface 77c and the third fluid pressure surface 78c is identical to the first fluid pressure surface 76c. The fluid pressure surfaces 76c, 77c, 78c are configured to influence a movement of the closure unit 68c, as a result of which a fluid-pressure-supported movement of the closure unit 68c is achievable and/or a pressure-compensated valve is implementable at least in an open position of the closure unit 68c, in which in particular a fluid flow from the inlet opening 60c to the outlet opening 62c is rendered possible. Alternatively a closure unit could comprise a different number of fluid pressure surfaces like, for example, at least four fluid pressure surfaces.

Beyond this the valve 28c comprises the actuator 26c with an actuator device according to the invention. The actuator 26c herein substantially corresponds to an actuator 26a of the first exemplary embodiment. The actuator 26c and in particular an actuation section 40c of an actuator element 12c is/are in the present case configured to bring about a movement of the closure unit 68c and in particular to at least partially hinder said movement by means of a shape-memory element 14c. For this purpose the actuator element 12c contacts the valve tappet 72c directly. The actuator element 12c is configured to exert a lifting force and/or push force onto the closure unit 68c and in particular onto the valve tappet 72c. The actuator element 12c is thus configured to move the closure unit 68c, counter to a pressure-closing force that is due at least to a fluid pressure, out of the closure position into at least one open position and advantageously into a plurality of different open positions. Moreover the actuator element 12c is configured to exert a tension force and/or reset force onto the closure unit 68c and in particular onto the valve tappet 72c, which allows moving the closure unit 68c in particular back into the closure position.

In FIG. 5 a further exemplary embodiment of the invention is shown. In the exemplary embodiment of FIG. 5 the letter d has been added. The further exemplary embodiment of FIG. 5 shows a further practical example of an actuator 26d, 27d corresponding to the preceding exemplary embodiments.

FIG. 5 shows a positioning system 30d, which is exemplarily implemented as an optical positioning system. The positioning system 30d serves in the present case for a positioning of at least one optical structural element 32d.

The optical structural element 32d is exemplarily embodied as a mirror and is supported movably around a support axis 80d.

For a positioning of the optical structural element 32d, the positioning system 30d exemplarily comprises, in the present case, two actuators 26d, 27d respectively comprising an actuator device according to the invention. The actuators 26d, 27d are in the present case at least substantially identical to one another and respectively comprise an actuator element 12d, 13d as well as a shape-memory element 14d, 15d. The actuators 26d, 27d herein substantially correspond to an actuator 26a of the first exemplary embodiment.

The actuator elements 12d, 13d feature an operative connection with the optical structural element 32d. The actuator elements 12d, 13d are in the present case configured to respectively effect a movement of the optical structural element 32d around the support axis 80d. Furthermore the shape-memory elements 14d, 15d are configured to at least partly hinder a movement of the actuator elements 12d, 13d and/or of the optical structural element 32d. Alternatively it is conceivable to use precisely one actuator, in particular for the purpose of achieving a linear positioning of an optical structural element. It is moreover conceivable to use an actuator with a plurality of actuator elements and/or to use further actuators like, for example, at least three and/or at least four actuators, advantageously each with an actuator device according to the invention. It is also conceivable to use different actuators, advantageously each with an actuator device according to the invention. In the latter case it is principally also conceivable to implement at least one actuator of the actuators as a conventional actuator, in particular without a shape-shiftable shape-memory element.

The invention claimed is:

1. An actuator device with at least one stationary unit, with at least one electromagnetic actuator element which is movable relative to the stationary unit, and with at least one shape-memory element which is implemented at least partly of a shape-shiftable shape-memory material, wherein the shape-memory element is configured, in at least one operation state, to at least partly hinder a movement of the actuator element in a first movement direction and in a second movement direction that differs from the first movement direction, at least via a mechanical deformation, and wherein the shape-memory element is transferable into at least one at least temporarily stable third shape.

2. The actuator device according to claim 1, wherein the shape-memory element is transferable from an at least temporarily stable first shape into at least one at least temporarily stable second shape.

3. The actuator device according to claim 1, wherein the shape-memory element is connected with the actuator element and/or with the stationary unit.

4. The actuator device according to claim 3, wherein the shape-memory element is connected with the actuator element and/or with the stationary unit via a clamp connection, via a glue connection, via a socketing connection and/or via a welding connection.

5. The actuator device according to claim 1, wherein the second movement direction is oriented counter to the first movement direction.

6. The actuator device according to claim 1, wherein a maximum movement distance of the actuator element along at least one direction is equivalent to at least 1% and/or maximally to 20% of a minimum extension of the shape-memory element along the direction.

7. The actuator device according to claim 1, further comprising at least one magnet setting unit, which is configured to effect a movement of the actuator element.

8. The actuator device according to claim 1, wherein the shape-memory material is implemented at least partly of a nickel-titanium alloy, an alloy containing nickel and titanium, a nickel-manganese-gallium alloy, an alloy containing nickel, manganese and gallium, a copper-zinc-aluminum alloy and/or a copper-aluminum-nickel alloy.

9. The actuator device according to claim 1, wherein the shape-memory material is implemented as a composite material.

10. The actuator device according to claim 1, wherein the shape-memory material is a magnetically active material, in particular a magnetic shape-memory material.

11. The actuator device according to claim 10, further comprising at least one magnet unit, which is configured, in at least one further operating state, to influence a shape of the shape-memory element.

12. The actuator device according to claim 11, wherein the magnet unit is configured, in the further operating state, to effect a deformation of the shape-memory element via a shape-shift magnetic field, and that the shape-memory element is configured to at least partly hinder a movement of the actuator element in the first movement direction and/or in the second movement direction by means of the magnetic deformation.

13. The actuator device according to claim 1, further comprising at least one securing unit, which is configured, in at least one error operating state, to bring about a movement of the actuator element and/or of the shape-memory element into a defined shape and/or location.

14. An actuator with at least one actuator device according to claim 1.

15. A valve with at least one actuator device according to claim 1.

16. A positioning system with at least one actuator device according to claim 1, in particular for a positioning of optical structural elements.

17. A method for an operation of an actuator device, in particular according to claim 1, wherein in at least one operating state a movement in a first movement direction and in a second movement direction that differs from the first movement direction is at least partially hindered at least via a mechanical deformation of a shape-shiftable shape-memory material.

18. An actuator device with at least one stationary unit, with at least one electromagnetic actuator element which is movable relative to the stationary unit, and with at least one shape-memory element which is implemented at least partly of a shape-shiftable shape-memory material, wherein the shape-memory element is configured, in at least one operation state, to at least partly hinder a movement of the actuator element in a first movement direction and in a second movement direction that differs from the first movement direction, at least via a mechanical deformation, and wherein the actuator device comprises at least one securing unit, which is configured, in at least one error operating state, to bring about a movement of the actuator element and/or of the shape-memory element into a defined shape and/or location.

19. An actuator device with at least one stationary unit, with at least one electromagnetic actuator element which is movable relative to the stationary unit, and with at least one shape-memory element which is implemented at least partly of a shape-shiftable shape-memory material, wherein the shape-memory element is configured, in at least one operation state, to at least partly hinder a movement of the actuator element in a first movement direction and in a second movement direction that differs from the first movement direction, at least via a mechanical deformation, wherein the shape-memory material is a magnetically active material, in particular a magnetic shape-memory material, wherein the actuator device comprises at least one magnet unit, which is configured, in at least one further operating state, to influence a shape of the shape-memory element by effecting a deformation of the shape-memory element via a shape-shift magnetic field, and wherein the shape-memory element is configured to at least partly hinder a movement of the actuator element in the first movement direction and/or in the second movement direction by means of the magnetic deformation.

* * * * *